(12) United States Patent
Takashima et al.

(10) Patent No.: US 9,234,296 B2
(45) Date of Patent: Jan. 12, 2016

(54) APPARATUS HAVING HEAT INSULATING CYLINDER WITH STEP PORTION FOR MANUFACTURING SEMICONDUCTOR SINGLE CRYSTAL

(75) Inventors: Shou Takashima, Echizen (JP); Yuuichi Miyahara, Echizen (JP); Atsushi Iwasaki, Echizen (JP); Nobuaki Mitamura, Nishishirakawa (JP); Susumu Sonokawa, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 357 days.

(21) Appl. No.: 13/813,551

(22) PCT Filed: Jul. 6, 2011

(86) PCT No.: PCT/JP2011/003866
§ 371 (c)(1),
(2), (4) Date: Jan. 31, 2013

(87) PCT Pub. No.: WO2012/026062
PCT Pub. Date: Mar. 1, 2012

(65) Prior Publication Data
US 2013/0125810 A1    May 23, 2013

(30) Foreign Application Priority Data

Aug. 26, 2010 (JP) ................................. 2010-189129

(51) Int. Cl.
*C30B 15/14* (2006.01)
*C30B 29/06* (2006.01)
*C30B 15/30* (2006.01)

(52) U.S. Cl.
CPC ................. *C30B 15/14* (2013.01); *C30B 29/06* (2013.01); *C30B 15/30* (2013.01); *Y10T 117/1068* (2015.01)

(58) Field of Classification Search
CPC ........ C30B 15/00; C30B 15/14; C30B 15/20; Y10T 117/00; Y10T 117/10; Y10T 117/106; Y10T 117/1024; Y10T 117/1032; Y10T 117/1068
USPC ............. 117/11, 13, 200, 206, 208, 217–218, 117/928, 931, 932
See application file for complete search history.

(56) References Cited

U.S. PATENT DOCUMENTS 6,183,553 B1   2/2001 Holder et al.
2009/0175767 A1*  7/2009 Lew et al. ..................... 422/109

FOREIGN PATENT DOCUMENTS

JP    A-4-46099    2/1992
JP    A-9-235181   9/1997
(Continued)

OTHER PUBLICATIONS

International Search Report issued in International Application No. PCT/JP2011/003866 dated Aug. 2, 2011.

*Primary Examiner* — Kenneth A Bratland, Jr.
(74) *Attorney, Agent, or Firm* — Oliff PLC

(57) ABSTRACT

The present invention is a semiconductor single crystal manufacturing apparatus including, within a growth furnace main body, a crucible, and a heater disposed around the crucible, wherein a heat insulating cylinder is disposed around the heater within the growth furnace main body, the heat insulating cylinder includes a step portion dividing the heat insulating cylinder into the upper part and the lower part at the inside surface thereof, the inner diameter of the lower part is larger than the inner diameter of the upper part, a heat insulating plate is disposed below the heater and on the inside of the lower part of the heat insulating cylinder within the growth furnace main body, and the diameter of the heat insulating plate is larger than the inner diameter of the upper part of the heat insulating cylinder and is smaller than the inner diameter of the lower part.

16 Claims, 5 Drawing Sheets

(56) References Cited

FOREIGN PATENT DOCUMENTS

| JP | A-2000-53486 | 2/2000 |
| JP | A-2002-68886 | 3/2002 |
| JP | A-2002-326888 | 11/2002 |
| JP | 2003212691 A * | 7/2003 |
| JP | A-2003-212691 | 7/2003 |

* cited by examiner

*1: VALUES WHEN THE VALUE OF COMPARATIVE EXAMPLE 1 IS ASSUMED TO BE 100%

APPARATUS HAVING HEAT INSULATING CYLINDER WITH STEP PORTION FOR MANUFACTURING SEMICONDUCTOR SINGLE CRYSTAL

TECHNICAL FIELD

The present invention relates to a semiconductor single crystal manufacturing apparatus adapted for growing a silicon single crystal or a compound semiconductor single crystal such as GaAs (gallium arsenide) by the Czochralski method (hereinafter sometimes referred to as the CZ method) and relates to a method for manufacturing the semiconductor single crystal by using the apparatus.

BACKGROUND ART

In typical semiconductor single crystal manufacturing apparatuses by the CZ method, there is provided a crucible for containing a raw material melt within a growth furnace main body (sometimes referred to as a main chamber), and a heater is disposed around the crucible to melt the raw material within the crucible to immerse a seed crystal into the raw material melt while maintaining keep the temperature of the molten raw material melt constant to pull upwardly the seed crystal while rotating seed crystal and crucible in directions opposite to each other to thereby grow a semiconductor single crystal beneath the seed crystal. At this time, in order to efficiently perform heating of the raw material melt by the heater, and to protect the furnace walls of the metallic growth furnace main body from radiant heat of the heater, there are disposed insulating members made of such a material as graphite in the vicinity of the internal walls of the growth furnace main body. By those insulating members, it becomes possible to keep the heat inside of the growth furnace main body and to protect the furnace walls, and thus to suppress excess heating of the heater to keep the temperature of raw material melt constant without wastefulness.

Moreover, in recent years, in growth of semiconductor single crystals, particularly in growth of silicon single crystals serving as material of each silicon wafer used for manufacturing integrated circuits etc., it is necessary to grow a crystal in which grown-in defects internally introduced at the time of growing the single crystal have been suppressed so as to have an extremely low density because there is a tendency such that semiconductor devices formed at a wafer surface layer will be miniaturized more and more. In view of the above, there has been frequently used a method of disposing a graphite member such as a cooling cylinder and a heat insulating ring above the raw material melt to pull upwardly the crystal while controlling the cooling rate of the crystal with high precision.

However, in such a method of controlling the crystal cooling rate, there are many restrictions according to the growth condition, for example, the fact to suppress radiant heat delivered from the heater and the raw material melt to the crystal to be grown as small as possible, and the fact that formation precision of temperature gradient in the crystal pulling axis direction are required. As a result, there was a predetermined limitation for the purpose of increasing the pulling rate to improve productivity of growth of the single crystal. In particular, in the growth of large-sized silicon single crystal having a diameter exceeding 200 mm or 300 mm, it is necessary to fill raw material of 100 kg or more into a large-sized crucible to melt it thereafter to perform crystal growth while maintaining the atmosphere within the growth furnace main body at a temperature to 1400° C. or more. As a result, it is considered that the calorific value of the heater becomes large, and radiant heat from the heater constitutes an obstruction also at the time of cooling a single crystal pulled upwardly from the raw material melt so that cooling of the crystal is hindered, thus making it difficult to dramatically realize speeding up of the pulling rate.

Moreover, in order to pull upwardly a single crystal having a large diameter and a long constant diameter part as described above, there is also being made such an attempt to use an apparatus for manufacturing a semiconductor single crystal in which the growth furnace main body is enlarged and expansion of the space where raw material is disposed is performed. In this case, it becomes difficult to efficiently perform heat insulation of its internal space following enlargement of the growth furnace main body. Accordingly, it would be inevitable to increase heat amount of the heater for the purpose of holding a raw material melt at a high temperature in melting the raw polycrystalline material or at the time of growing a single crystal.

In view of the above, there is proposed a method of lessening heat outflow toward the lower part of the growing furnace by using a heat insulating plate.

For example, Patent Literature 1 discloses a single crystal pulling method of controlling oxygen concentration taken into a single crystal by changing the number of laminated heat insulating plates disposed below a crucible.

Moreover, Patent Literature 2 discloses a crystal pulling apparatus in which there is disposed a heat conduction radiation member for receiving radiant heat from a heater to transmit the heat by thermal conduction to a part below a crucible to discharge the radiant heat toward the crucible.

Further, Patent Literature 3 discloses a semiconductor single crystal manufacturing apparatus having a heat insulating plate disposed under a crucible and capable of performing vertical movement drive by a heat insulating plate lifting mechanism.

CITATION LIST

Patent Literature

Patent Literature 1: Japanese Unexamined Patent Publication (Kokai) No. H9-235181
Patent Literature 2: Japanese Unexamined Patent Publication (Kokai) No. 2000-53486
Patent Literature 3: Japanese Unexamined Patent Publication (Kokai) No. 2002-326888

SUMMARY OF THE INVENTION

Technical Problem

In a semiconductor single crystal manufacturing apparatus having a heat insulating plate as described above, both in the case of individually lifting the heat insulating plate and a heater by a lifting mechanism, and in the case of lifting the heat insulating plate and the heater by means of an integrated lifting mechanism, spacings for performing mechanical operation are respectively required between the heat insulating cylinder and the heater, between the heat insulating cylinder and the heat insulating plate, and between the heater and the insulating plate. There was the problem that radiant heat energy at the lower part of the heater may easily leak out through these spacings into a bottom part of chamber, leading to lowering of thermal efficiency.

The present invention has been made in view of the problems as described above, and an object thereof is to provide a semiconductor single crystal manufacturing apparatus capable of enhancing the heat insulating effect around a crucible for containing a raw material melt, and of sufficiently performing realization of increase in the growth rate of the semiconductor single crystal and stabilization of the quality of the semiconductor single crystal even if calorific value (i.e., power consumption) of a heater disposed outside the crucible is suppressed.

Solution to Problem

The present invention has been made in order to solve the above-described problems. The present invention provides a semiconductor single crystal manufacturing apparatus at least including, within a growth furnace main body, a crucible, and a heater disposed around the crucible to pull upwardly a semiconductor single crystal by the Czochralski method from a raw material melt while heating the raw material melt contained within the crucible by means of the heater, wherein a heat insulating cylinder is disposed around the heater within the growth furnace main body, and the heat insulating cylinder has, at an inside surface thereof, a step portion dividing the heat insulating cylinder into an upper part and a lower part, and the inner diameter of the lower part is larger than the inner diameter of the upper part; and wherein a heat insulating plate is disposed below the heater and on the inside of the lower part of the heat insulating cylinder within the growth furnace main body, and the outer diameter of the heat insulating plate is larger than the inner diameter of the upper part of the heat insulating cylinder and is smaller than the inner diameter of the lower part of the heat insulating cylinder.

In the case where the semiconductor single crystal manufacturing apparatus constituted in this way is employed, since the heat insulating plate of the predetermined shape is disposed at the lower part of the heater disposed around the crucible within the growth furnace main body in pulling upwardly and growing the semiconductor single crystal by the CZ method to manufacture it, the heat insulating effect around the crucible is enhanced to have ability to concentrate a sufficient caloric value into the raw material melt even if an output of the heater is suppressed to a certain degree. Thus, an excessive radiant heat from the heater is suppressed. As a result, the cooling efficiency of the semiconductor single crystal to be grown is enhanced. Further, realization of further increase in the pulling rate and stabilization of quality of the semiconductor single crystal can be performed with decreasing power consumption by the heater.

In this case, it is preferable that the heat insulating cylinder is configured so that the thickness of the lower part is 30 to 70% of the thickness of the upper part.

As described above, if the thickness of the lower part of the heat insulating cylinder is 30 to 70% of the thickness of the upper part of the heat insulating cylinder, it is possible to more effectively insulate radiation from the bottom part of the heater to prevent outflow of the thermal energy into the bottom part of the growth furnace main body.

Moreover, it is preferable that the heat insulating plate may be driven upwardly by a heat insulating plate lifting mechanism along with the crucible.

In the case where the heat insulating plate may be driven upwardly by the heat insulating plate lifting mechanism together with the crucible, it becomes possible to maintain, at all times, the state where the periphery of the crucible is efficiently heat-insulated irrespectively of the position of the crucible. As a result, it becomes possible to suitably maintain the temperature distribution around the crucible over the entirety of the single crystal growth process.

In this case, the heater can be vertically driven by a heater lifting mechanism, and the heater lifting mechanism may double as the heat insulating plate lifting mechanism. Thus, simplification of the apparatus configuration can be realized.

Further, in this case, the heater and the heat insulating plate may be incorporated through a common base, and the heat insulating plate lifting mechanism doubling as the heater lifting mechanism may vertically drive the common base. Thus, still simpler configuration can be realized.

Moreover, the present invention provides a semiconductor single crystal manufacturing method of pulling upwardly a semiconductor single crystal by the Czochralski method from the raw material melt while heating the raw material melt contained within the crucible by means of the heater within the growth furnace main body to grow the semiconductor single crystal thus pulled upwardly by using any one of the semiconductor single crystal manufacturing apparatuses.

In the case where there is employed a semiconductor single crystal manufacturing method using any one of the semiconductor single crystal manufacturing apparatuses, the heat insulating effect around the crucible is enhanced in the semiconductor single crystal manufacturing process, thus making it possible to concentrate a sufficient calorific value even if an output of the heater is suppressed to a certain degree. Thus, any excess radiant heat from the heater is suppressed so that the cooling efficiency of the semiconductor single crystal to be grown is enhanced. As a result, realization of further increase in pulling rate and stabilization of quality of the semiconductor single crystal can be performed with decreasing power consumption of the heater.

Advantageous Effects of Invention

In accordance with the semiconductor single crystal manufacturing apparatus according to the present invention, the heat insulating effect around the crucible in manufacturing a semiconductor single crystal through pulling and growing processes for the semiconductor single crystal by the CZ method is enhanced, thus making it possible to concentrate a sufficient calorific value into a raw material melt even if an output of the heater is suppressed to a certain degree. In this way, any excess radiant heat from the heater is suppressed so that the cooling efficiency of a semiconductor single crystal to be grown is enhanced. As a result, realization of further increase in pulling rate and stabilization of quality of the semiconductor single crystal can be performed with reducing power consumption by the heater. In addition, since an output of the heater can be suppressed to a certain degree, it is also possible to suppress deterioration of the heater and the crucible, thus making it possible to realize an improvement in the life-time of each member.

DESCRIPTION OF EMBODIMENTS

The present invention will now be described in detail with reference to the drawings, but the present invention is not limited to such implementation. The present invention may be applied to various methods of pulling upwardly semiconductor single crystal. Explanation will now be given mainly by taking, as an example, the case where a silicon single crystal is manufactured.

Figure 1:
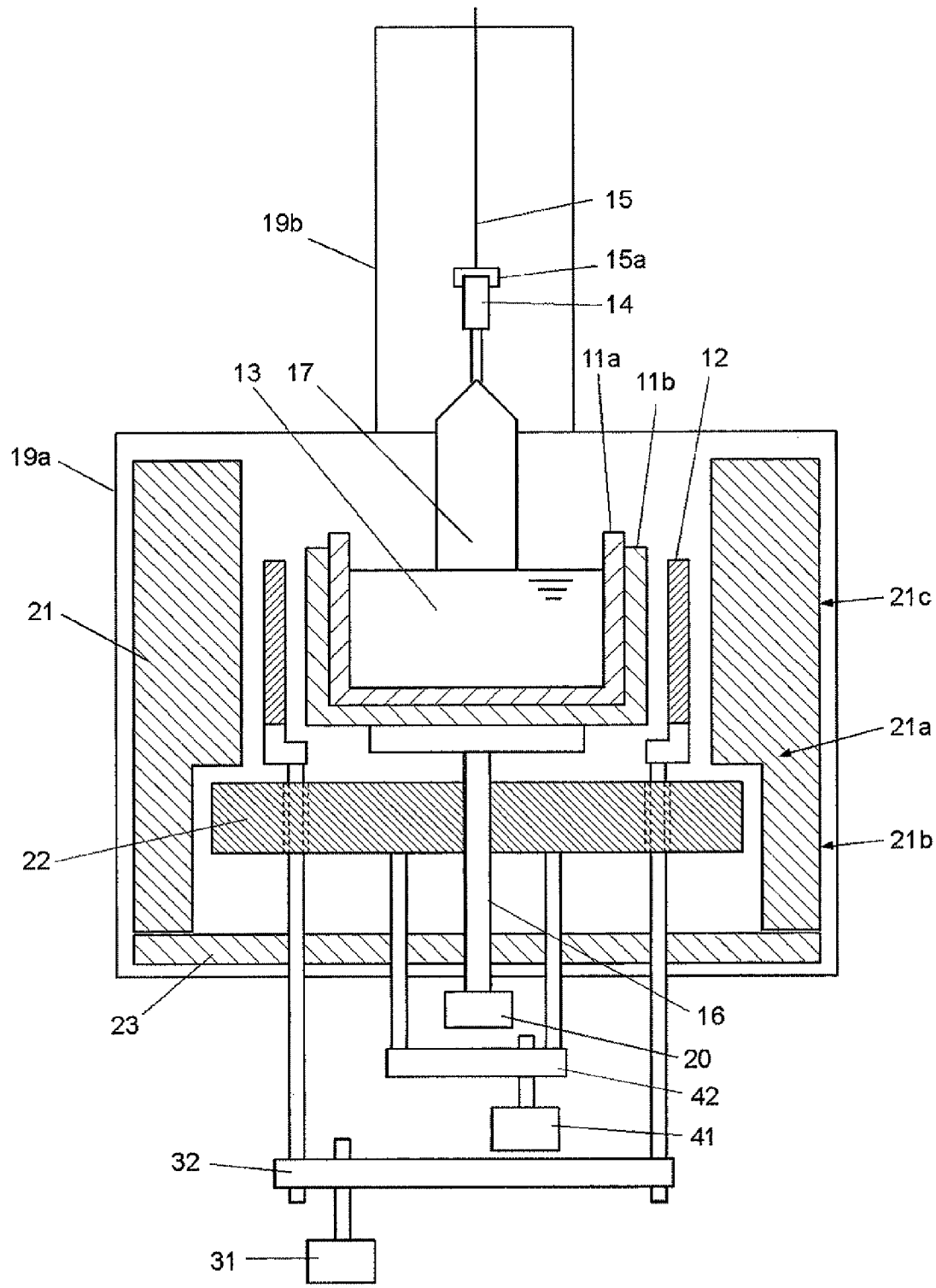
FIG. 1 is a schematic cross sectional view showing an example of an embodiment of a semiconductor single crystal manufacturing apparatus according to the present invention.

FIG. 1 is a schematic cross sectional view showing one embodiment of a semiconductor single crystal manufacturing apparatus according to the present invention adapted for growing a semiconductor single crystal by the CZ method. The semiconductor single crystal manufacturing apparatus shown in FIG. 1 comprises a growth furnace main body (which is also referred as a main chamber) 19a for containing a raw material melt 13 serving as material of the semiconductor single crystal, and an upper growth furnace (which is also referred as a pulling chamber) 19b which is in contact with the growth furnace main body 19a and which is for holding and taking out the semiconductor single crystal pulled from the raw material melt 13.

The crucible (inside crucible) 11a within which the raw material melt 13 is contained is disposed in the vicinity of the center of the inside of the growth furnace main body 19a to allow the heater 12 provided around the crucible (outside crucible) 11b to be in heated state to thereby melt a raw material to hold it as a high temperature melt. In the case where a semiconductor single crystal 17 to be grown is a silicon single crystal, a crucible adapted for directly holding the raw material melt 13 is a quartz crucible 11a. Since this quartz crucible 11a is soften at a high temperature, and is brittle and easy to be broken, the outside of the quartz crucible 11a is covered with a graphite crucible 11b. Further, in the growth of the single crystal by the CZ method, since a crystal is grown while rotating the quartz crucible 11a and the semiconductor single crystal 17 in directions opposite to each other, a crucible supporting shaft 16 is attached at the lower part of the graphite crucible 11b so that they move in upper and lower directions and rotatably by a crucible rotation lifting mechanism 20 attached at the lower part of the outside of the growth furnace main body 19a. In addition, in growing the single crystal, since it is preferable to perform working with the melt surface of the raw material melt 13 being maintained at a constant level for the purpose of allowing the crystal quality to be desired, there is provided the crucible rotation lifting mechanism 20 capable of holding the melt surface of the raw material melt 13 at a desired position.

Moreover, a pulling member winding mechanism (not shown) for winding off and rewinding in a pulling member 15 such as wire for upwardly winding the single crystal 17 is provided at a ceiling part of the upper growth furnace 19b, and a seed crystal holder 15a for holding a seed crystal 14 is provided at the front end part of the pulling member 15 which has been wound off from the pulling member winding mechanism. In growing the single crystal 17, the pulling member 15 is wound off from the pulling member winding mechanism to allow the front end part of the seed crystal 14 to come into contact with the melt surface of the raw material melt 13 to quietly pull upwardly it to thereby grow the single crystal 17 below the seed crystals 14. Further, the upper growth furnace 19b is caused to adjust inactive gas amount to be introduced into the furnace by a gas supply tube (not shown) for introducing inactive gas into the furnace and a gas flow rate control device attached to the gas supply tube, and inactive gas introduced into the furnace is evacuated by a gas evacuating tube (not shown) provided on the bottom part of the growth furnace main body 19a.

On the other hand, a heat insulating cylinder 21 for protecting the furnace walls from radiant heat of high temperature by the heater 12 to efficiently perform heat insulation of the inside of the growth furnace main body 19a is provided between the heater 12 and the furnace walls of the growth furnace main body 19a. Moreover, a bottom heat insulating member 23 is provided also on the bottom part of the growth furnace main body 19a with a view to protecting the furnace walls from the high-temperature radiant heat, performing heat insulation of the inside of the growth furnace main body 19a, and holding the raw material melt 13 so that the raw material melt does not flow out toward the outside of the growth furnace main body 19a even if the raw material melt 13 might flow out from the crucible 11a. Further, a heat insulating plate 22 is provided between the bottom heat insulating member 23 and the heater 12. Thus, heat radiated from the crucible 11a or the heater 12 toward the lower part of the growth furnace main body 19a or the bottom heat insulating member 23 is insulated. The heat insulating plate 22 can be moved in upper and lower directions by the heat insulating plate lifting mechanism 41. Further, in order to obtain a desired crystal quality at the time of growing single crystal, there is employed a mechanism capable of holding the heat insulating plate 22 at a desired position through a heat insulating plate lifting base 42 by means of the heat insulating lifting mechanism 41.

Further, the semiconductor single crystal manufacturing apparatus according to the present invention may include a step portion 21a dividing the heat insulating cylinder 21 into the upper part and the lower part at the inside surface thereof, wherein the inner diameter of the lower part 21b is caused to be larger than the inner diameter of the upper part 21c. Moreover, it is particularly preferable that the heat insulating cylinder 21 is configured so that the body part thereof is caused to be 80 mm or larger. Further, it is preferable that a step 21a is formed at the heat insulating cylinder 21 so that the thickness of lower part 21b of the heat insulating cylinder 21 is caused to be 30 to 70% of the thickness of the upper part 21c of the heat insulating cylinder 21. The position where the step 21a is formed is caused to be a position of the uppermost position or more of the position of the heat insulating plate 22 through the time when the crystal is grown from the time when raw material is molten.

It is to be noted that it is desirable that the heat insulating cylinder 21 includes a body part made of carbon fiber.

Moreover, the outer diameter of the heat insulating plate 22 may be larger than the inner diameter of the upper part 21c of the heat insulating cylinder 21, and may be smaller than the inner diameter of the lower part 21b of the heat insulating cylinder 21. Moreover, it is particularly preferable that the thickness of the heat insulating plate is 50 mm or more. It is desirable that the heat insulating plate 22 includes a body part made of carbon fiber.

Further, in pulling of the semiconductor single crystal 17, there is formed the state where the heat insulating plate 22 is fitted into the step portion 21a of the heat insulating cylinder 21 as shown in FIG. 1, i.e., the heat insulating plate 22 is disposed below the heater and on the inside of the lower part 21b (below the step portion 21a) of the heat insulating cylinder 21 to thereby prevent radiant heat from the lower part of the heater 12 during growth of crystal from directly arriving at the bottom heat insulating member 23. Thus, it is possible to efficiently transmit heater power to the raw material melt 13.

In this way, there is employed such an arrangement that the step portion 21a of the heat insulating cylinder 21 and the heat insulating plate 22 are fitted with each other so that the heat insulating plate 22 is caused to be larger than the aperture of the heater 12. As a result, there is no possibility that the radiant heat from the lower part of the heater 12 may be directly reached to the chamber lower part to directly receive such radiant heat by the heat insulating cylinder 21 and the heat insulating plate 22, thus making it possible to efficiently reflect it toward a part below the crucible.

Moreover, in the present invention, it is preferable that, at the time of pulling upwardly the semiconductor single crystal, the heater 12 can be upwardly driven through the heater lifting base 32 by the heater lifting mechanism 31 along with the crucibles 11a, 11b and the heat insulating plate 22. Thus, the crucibles 11a, 11b are elevated in accordance with a decrease of the raw material melt 13 based on the crystal growth, and the thermal capacity of the entirety of the crucible within which the raw material melt 13 is contained is also further changed. However, the heater 12 is caused to rise following the crucibles 11a, 11b, thereby making it possible to move the center of heat of the heater 12 in correspondence with movement of the crucibles 11a, 11b, in turn, decrease of the raw material melt 13. Accordingly, more suitable heating for raw material melt 13 can be performed.

Further, movements of the heat insulating plate 22 and the heater 12 are combined to thereby have ability to adjust the temperature atmosphere within the furnace with a higher precision. Thus, efficient heating of the raw material melt 13 can be attained.

Figure 2:
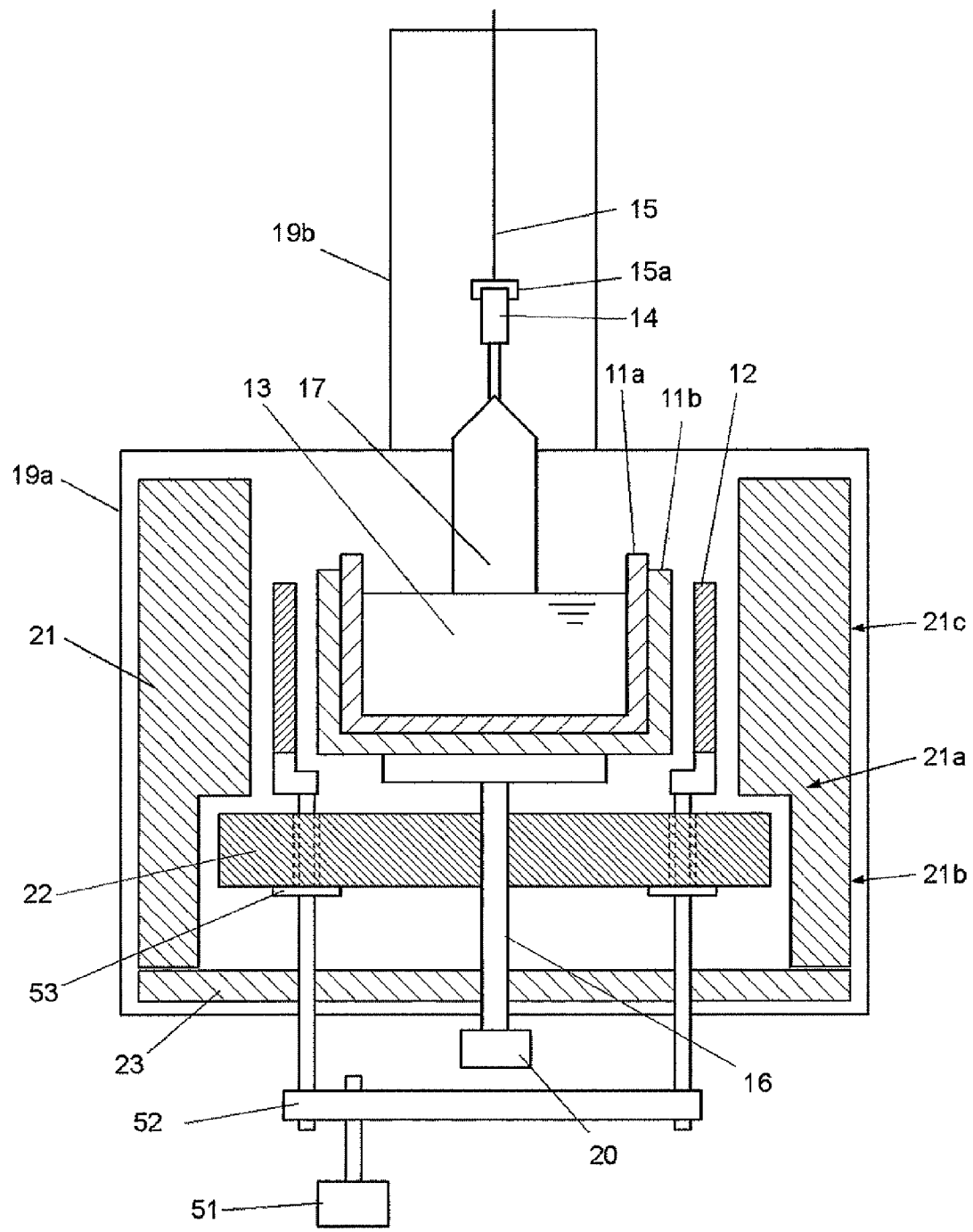
FIG. 2 is a schematic cross sectional view showing another example of the embodiment of the semiconductor single crystal manufacturing apparatus according to the present invention.

FIG. 2 is a schematic cross sectional view showing an embodiment in which the heater 12 and the heat insulating plate 22 are integrated through the common base as another example of the embodiment of the semiconductor single crystal manufacturing apparatus according to the present invention.

In this embodiment, the heat insulating plate 22 and the heater 12 are driven through the common base (common vertical lifting base) 52 by means of the integrated lifting mechanism 51. The heat insulating plate 22 is supported by the heat insulating plate supporting insulator 53 consisting of insulators such as aluminum oxide or quartz glass. Thus, such a device is made that a supply current to the heater 12 does not flow toward the heat insulating plate 22 side. Other components are similar to those of the embodiment of the semiconductor single crystal manufacturing apparatus shown in FIG. 1.

On the other hand, in the case where there is employed as shown in FIG. 1 such a configuration to vertically drive the heater 12 independently of the heat insulating plate 22 by the heater lifting mechanism 31 provided separately from the heat insulating plate lifting mechanism 41, it is possible to finely comply with, for example, heat capacity change of the entirety of the crucibles followed by decrease in the raw material melt 13. Thus, it becomes possible to control the atmospheric temperature with a higher precision to pull upwardly the high quality semiconductor single crystal 17.

In the semiconductor single crystal manufacturing apparatus of the present invention, there can be provided storage device (not shown) for storing various pulling patterns of the semiconductor single crystal 17, crucible elevating control part (not shown) for performing the operating control of the crucible rotation and lifting mechanism 20 so that the crucible rises following pulling of the semiconductor single crystal 17 on the basis of the pulling pattern data stored in the storage device, and heat insulating plate elevating control part (not shown) for performing the operating control of the heat insulating plate lifting mechanism 41 so that the heat insulating plate 22 rises following elevation of the crucibles 11a, 11b. Further, there may be provided heater elevating control part (not shown) for performing the operating control of the heater lifting mechanism 31 so as to combine the heater 12 therewith to move it. Even in the case where the same apparatus is used, any different type of the pulling patterns of the semiconductor single crystal 17 may be employed depending upon, e.g., the size or the quality level of the required semiconductor single crystal 17. In view of above, when there is employed such a scheme to store various pulling patterns of the semiconductor single crystal 17 in a storage device to read out any one of necessary pulling patterns as occasion demands to apply the pulling pattern which has been read out to the apparatus drive, and to control the elevating drive of the crucibles 11a, 11b or the heat insulating plate 22 and the heater 12 on the basis of any one of the pulling pattern data which has been read out, it is possible to thereby have ability to easily comply with even the case where the lots of single crystals to be manufactured are changed, in turn, it is possible to conveniently manufacture various kinds of single crystals by using the same apparatus.

EXAMPLES

The present invention will now be explained in more detail with reference to the Examples and the Comparative Examples, but it should be noted that this does not limit the present invention.

In order to confirm advantageous effects of the present invention, the following experiments were conducted.

Example 1, Example 2

(1) The Growth Conditions for the Single Crystals

The semiconductor single crystal manufacturing apparatus of the present invention shown in FIG. 2 was used to grow the silicon single crystals under the following conditions.

a) Raw material: Polycrystalline silicon of 200 kg was filled into a quartz crucible 11a having aperture of 650 mm.

b) Growth crystal: The diameter was set to 200 mm. As the seed crystal 14, there was used a seed crystal having orientation in the crystal axis direction of <100>.

c) A heat insulating plate 22 having a thickness of 80 mm was used. The outer diameter of the heat insulating plate 22 has the condition of Example 1 and Example 2 described in Table 1.

d) Heater 12: A heater having the length of slit overlapping interval (heating part) of 200 mm was used.

e) A heat insulating cylinder 21 having an upper part thickness of 90 mm was used. The inner diameter of the heat insulating cylinder upper part and the inner diameter of the heat insulating cylinder lower part are respectively caused to have the conditions of Example 1 and Example 2 described in Table 1.

f) A horizontal magnetic field having central magnetic flux density of 4000 G was applied to grow a single crystal.

Under these conditions, single crystals were repeatedly manufactured while moving the heat insulating plate 22 and the heater 12 in correspondence with movements of the crucibles 11a, 11b.

TABLE 1

|  | Example 1 | Example 2 | Comparative Example 1 | Comparative Example 2 |
|---|---|---|---|---|
| Heat insulating cylinder upper part inner diameter | 840 | 840 | 840 | 840 |
| Heat insulating cylinder lower part inner diameter | 960 | 900 | No step | 860 |
| Heat insulating plate outer diameter | 920 | 860 | 760 | 820 |
| Overlap of heat insulating cylinder upper part and heat insulating plate | 40 | 10 | −40 (No overlap) | 10 (No overlap) |

(Unit: mm)

In the above-mentioned silicon single crystal manufacturing process, in regard to a power consumed for growing a constant diameter part of the silicon single crystal (average value of powers in forming the constant diameter part of the crystal), a single crystal could be grown by a power consumption lesser by about 10% both in Example 1 and in Example 2 as compared to the case where the conventional heat insulating plate was used (Comparative Example 1 which will be described later). Moreover, deformation of the crucible taking place resulting from the fact the quartz crucible 11a was heated at a high temperature for a long time was also hardly observed. Thus, it was confirmed that load based on heating onto the crucible was lessened.

Comparative Example 1

Figure 3:
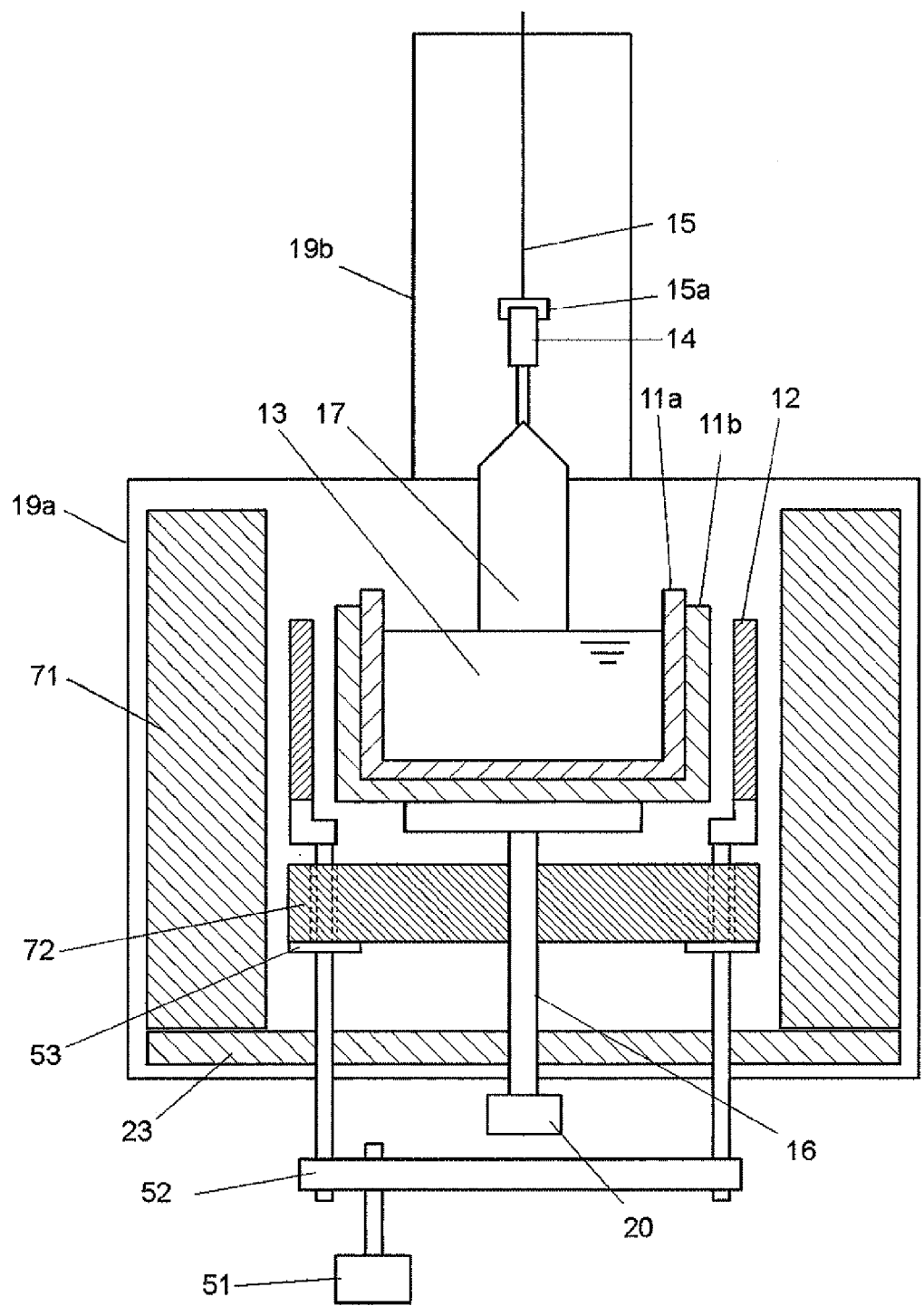
FIG. 3 is a cross sectional view showing schematically a semiconductor single crystal manufacturing apparatus used in Comparative Example 1.

By using the semiconductor single crystal manufacturing apparatus shown in FIG. 3, a silicon single crystal having a diameter of 200 mm was pulled upwardly under the conditions which are substantially the same as those of the Examples 1 and 2 except for the condition also shown in Table 1. The semiconductor single crystal manufacturing apparatus shown in FIG. 3 is a manufacturing apparatus exchanged from the manufacturing apparatus shown in FIG. 2 to a manufacturing apparatus in which a heat insulating plate and a heat insulating cylinder (heat insulating plate 72 and heat insulating cylinder 71) are not of the arrangement in which they are fitted with each other. There is no step at the heat insulating cylinder 71, and the inner diameter thereof and the outer diameter of the heat insulating plate 72 were set to the condition of Comparative Example 1 shown in Table 1.

As a result, a power consumption at the time of forming the constant diameter part of the crystal was increased by about 10% as compared to Example 1. Further, as the result of the fact that the state of the quartz crucible 11a was observed after the crystal has been pulled upwardly, a distortion which is deemed to be deformed by heating is observed at a part of the upper part of the crucible 11a resulting from increase in radiant heat from the heater 12. It is considered that this is because calorific value of the heater 12 is increased resulting from the fact that outflow amount of thermal energy to the bottom part of the chamber (bottom heat insulating member 23) has been increased from a gap between the heat insulating plate 72 and the heat insulating cylinder 71 so that atmospheric temperature immediately above the raw material melt 13 is caused to be high.

Comparative Example 2

Figure 4:
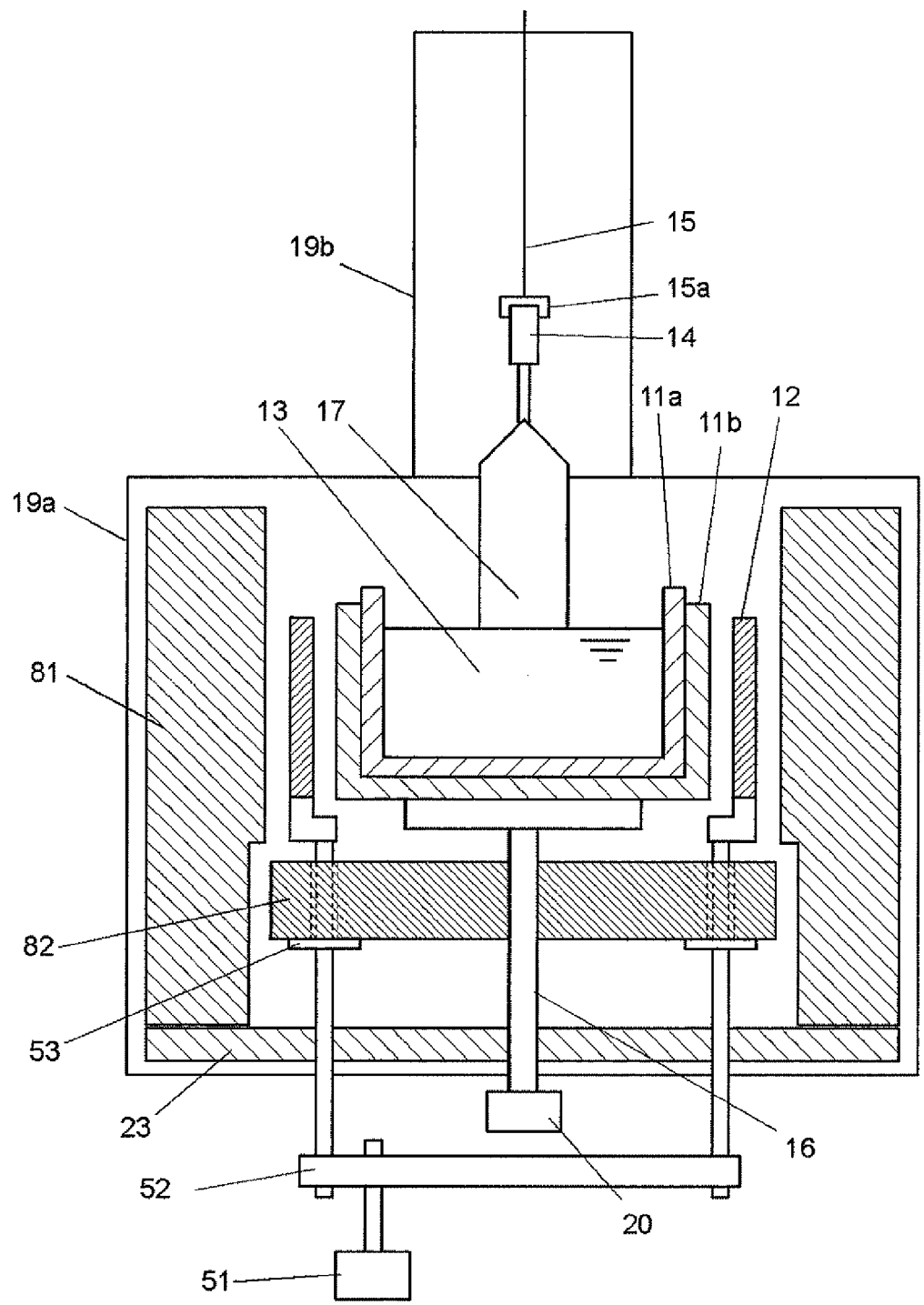
FIG. 4 is a cross sectional view showing schematically a semiconductor single crystal manufacturing apparatus used in Comparative Example 2.

By using the semiconductor single crystal manufacturing apparatus shown in FIG. 4, a silicon single crystal having a diameter of 200 mm was pulled upwardly under the conditions which are substantially the same as those of Examples 1, 2 except for the condition also shown in Table 1. The semiconductor single crystal manufacturing apparatus shown in FIG. 4 is a manufacturing apparatus exchanged from the manufacturing apparatus shown in FIG. 2 to a manufacturing apparatus in which a heat insulating cylinder 81 has a step, but the outer shape of a heat insulating plate 82 is smaller than the inner diameter of the upper part of the heat insulating cylinder 81, and there is no overlap at the heat insulating cylinder 81 and the heat insulating plate 82. The inner diameter of the heat insulating cylinder 81 and the outer diameter of the heat insulating plate 82 are set to the conditions of Comparative Example 2 shown in Table 1.

As a result, power consumption at the time of forming the constant diameter part of the crystal is increased by about 9% as compared to Example 1, and there was a result similar to Comparative Example 1. Further, after completion of pulling of the crystal, similarly to Comparative Example 1, in regard to the state of the quartz crucible 11a, a distortion which is deemed to be deformed by heating was observed at a portion of the upper part of the crucible 11a. It is considered that this is because even if the heat insulating plate 22 is enlarged, the outer diameter of the heat insulating plate 22 is smaller than the inner diameter of the heat insulating cylinder upper part and in the case where any gap is formed, it was impossible to prevent outflow of thermal energy to the bottom part of the chamber (bottom heat insulating member 23).

Figure 5:
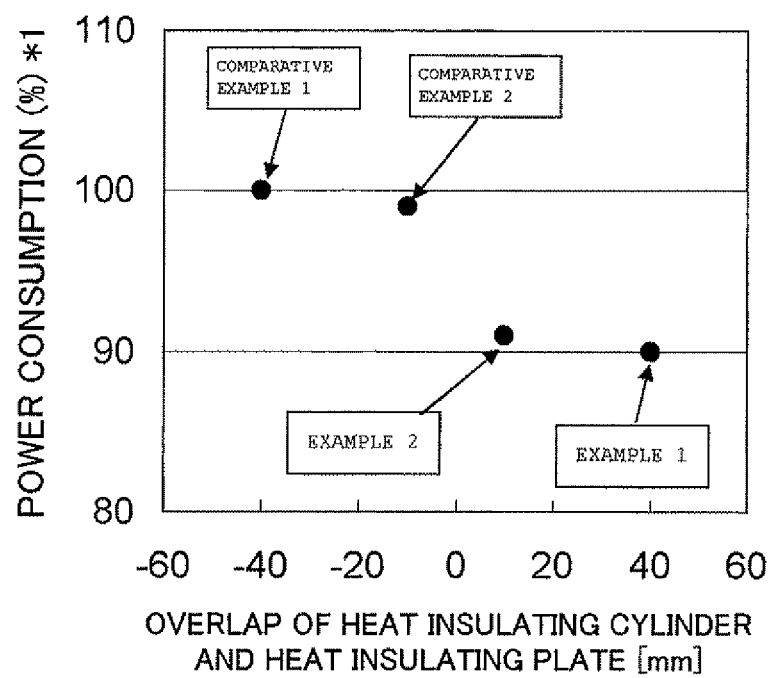
FIG. 5 is a graph showing measurement results of the Examples and the Comparative Examples.

The measured results of these Examples and the Comparative Examples were compared by describing together values in the case where the value of Comparative Example 1 is assumed to be 100%, and are shown in FIG. 5. From this figure, it is considered that providing a part overlapping at the outer diameter of the heat insulating plate and the inner diameter of the heat insulating cylinder upper part advantageously insulates radiation from the bottom part of the heater to prevent outflow of thermal energy to the bottom part of the chamber. Moreover, in regard to the thickness of the heat insulating cylinder, it is desirable to form the step at the heat insulating cylinder so that the thickness of the heat insulating cylinder upper part is caused to be 80 mm and the thickness of the heat insulating cylinder lower part is caused to be 30 to 70% of the thickness of the heat insulating cylinder upper part by taking into account the outer diameter of the heat insulating plate, the inner diameter of the heat insulating cylinder, fitting amount (difference between the inner diameter of the heat insulating cylinder upper part and the inner diameter of the heat insulating cylinder lower part) and the thickness of the step portion of the heat insulating cylinder.

It should be noted that the present invention is not limited to the above described embodiments. These embodiments are considered to be exemplary, and any matter which has a configuration substantially the same as the technical ideas described in the claims of the present invention, and which performs similar effects and advantages may be included within the technical scope of the present invention.

The invention claimed is:

1. A semiconductor single crystal manufacturing apparatus at least comprising, within a growth furnace main body, a crucible, and a heater disposed around the crucible to pull upwardly a semiconductor single crystal by the Czochralski method from a raw material melt while heating the raw material melt contained within the crucible by means of the heater, wherein a heat insulating cylinder is disposed around the heater within the growth furnace main body, and the heat insulating cylinder has, at an inside surface thereof, a step portion dividing the heat insulating cylinder into an upper part and a lower part, and the inner diameter of the lower part is larger than the inner diameter of the upper part; and wherein a heat insulating plate is disposed below the heater and on the inside of the lower part of the heat insulating cylinder within the growth furnace main body, the entire outer diameter of the heat insulating plate is larger than the inner diameter of the upper part of the heat insulating cylinder and is smaller than the inner diameter of the lower part of the heat insulating cylinder, and the heat insulating cylinder and the heat insulating plate are separated from each other by a gap and do not contact each other.

2. The semiconductor single crystal manufacturing apparatus according to claim 1, wherein the heat insulating cylinder is configured so that the thickness of the lower part is 30 to 70% of the thickness of the upper part.

3. The semiconductor single crystal manufacturing apparatus according to claim 1, wherein the heat insulating plate is driven upwardly by a heat insulating plate lifting mechanism along with the crucible.

4. The semiconductor single crystal manufacturing apparatus according to claim 2, wherein the heat insulating plate is driven upwardly by a heat insulating plate lifting mechanism along with the crucible.

5. The semiconductor single crystal manufacturing apparatus according to claim 3, wherein the heater is permitted to be vertically driven by a heater lifting mechanism, and the heater lifting mechanism serves to double as the heat insulating plate lifting mechanism.

6. The semiconductor single crystal manufacturing apparatus according to claim 4, wherein the heater is permitted to be vertically driven by a heater lifting mechanism, and the heater lifting mechanism serves to double as the heat insulating plate lifting mechanism.

7. The semiconductor single crystal manufacturing apparatus according to claim 5, wherein the heater and the heat insulating plate are integrated through a common base, and the heat insulating plate lifting mechanism doubling as the heater lifting mechanism is configured to vertically drive the common base.

8. The semiconductor single crystal manufacturing apparatus according to claim 6, wherein the heater and the heat insulating plate are integrated through a common base, and the heat insulating plate lifting mechanism doubling as the heater lifting mechanism is configured to vertically drive the common base.

9. A semiconductor single crystal manufacturing method of pulling upwardly a semiconductor single crystal by the Czochralski method from the raw material melt while heating the raw material melt contained within the crucible by means of the heater within the growth furnace main body to grow the semiconductor single crystal thus pulled upwardly by using the semiconductor single crystal manufacturing apparatus according to claim 1.

10. A semiconductor single crystal manufacturing method of pulling upwardly a semiconductor single crystal by the Czochralski method from the raw material melt while heating the raw material melt contained within the crucible by means of the heater within the growth furnace main body to grow the semiconductor single crystal thus pulled upwardly by using the semiconductor single crystal manufacturing apparatus according to claim 2.

11. A semiconductor single crystal manufacturing method of pulling upwardly a semiconductor single crystal by the Czochralski method from the raw material melt while heating the raw material melt contained within the crucible by means of the heater within the growth furnace main body to grow the semiconductor single crystal thus pulled upwardly by using the semiconductor single crystal manufacturing apparatus according to claim 3.

12. A semiconductor single crystal manufacturing method of pulling upwardly a semiconductor single crystal by the Czochralski method from the raw material melt while heating the raw material melt contained within the crucible by means of the heater within the growth furnace main body to grow the semiconductor single crystal thus pulled upwardly by using the semiconductor single crystal manufacturing apparatus according to claim 4.

13. A semiconductor single crystal manufacturing method of pulling upwardly a semiconductor single crystal by the Czochralski method from the raw material melt while heating the raw material melt contained within the crucible by means of the heater within the growth furnace main body to grow the semiconductor single crystal thus pulled upwardly by using the semiconductor single crystal manufacturing apparatus according to claim 5.

14. A semiconductor single crystal manufacturing method of pulling upwardly a semiconductor single crystal by the Czochralski method from the raw material melt while heating the raw material melt contained within the crucible by means of the heater within the growth furnace main body to grow the semiconductor single crystal thus pulled upwardly by using the semiconductor single crystal manufacturing apparatus according to claim 6.

15. A semiconductor single crystal manufacturing method of pulling upwardly a semiconductor single crystal by the Czochralski method from the raw material melt while heating the raw material melt contained within the crucible by means of the heater within the growth furnace main body to grow the semiconductor single crystal thus pulled upwardly by using the semiconductor single crystal manufacturing apparatus according to claim 7.

16. A semiconductor single crystal manufacturing method of pulling upwardly a semiconductor single crystal by the Czochralski method from the raw material melt while heating the raw material melt contained within the crucible by means of the heater within the growth furnace main body to grow the semiconductor single crystal thus pulled upwardly by using the semiconductor single crystal manufacturing apparatus according to claim 8.

* * * * *